(12) United States Patent
Hsieh et al.

(10) Patent No.: US 11,914,301 B2
(45) Date of Patent: Feb. 27, 2024

(54) PHOTORESIST, METHOD OF MANUFACTURING A SEMICONDUCTOR DEVICE AND METHOD OF EXTREME ULTRAVIOLET LITHOGRAPHY

(71) Applicant: TAIWAN SEMICONDUCTOR MANUFACTURING COMPANY, LTD., Hsinchu (TW)

(72) Inventors: Chieh-Hsin Hsieh, Hsinchu County (TW); Wei-Han Lai, New Taipei (TW); Ching-Yu Chang, Yilang County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 168 days.

(21) Appl. No.: 17/378,188

(22) Filed: Jul. 16, 2021

(65) Prior Publication Data

US 2023/0036859 A1   Feb. 2, 2023

(51) Int. Cl.
| | |
|---|---|
| *G03F 7/36* | (2006.01) |
| *G03F 7/00* | (2006.01) |
| *G03F 7/004* | (2006.01) |
| *G03F 7/039* | (2006.01) |
| *G03F 7/30* | (2006.01) |
| *G03F 7/38* | (2006.01) |
| *G03F 7/40* | (2006.01) |
| *H01L 21/027* | (2006.01) |
| *G03F 7/20* | (2006.01) |

(52) U.S. Cl.
CPC .............. *G03F 7/36* (2013.01); *G03F 7/0045* (2013.01); *G03F 7/039* (2013.01); *G03F 7/30* (2013.01); *G03F 7/38* (2013.01); *G03F 7/40* (2013.01); *G03F 7/70191* (2013.01); *H01L 21/0274* (2013.01); *G03F 7/2004* (2013.01)

(58) Field of Classification Search
CPC ..... G03F 7/30; G03F 7/38; G03F 7/40; G03F 7/07; G03F 7/36; G03F 7/0045; C08F 220/38; C08F 220/382; C08F 222/24; C08F 228/00; C08F 228/02
See application file for complete search history.

(56) References Cited

U.S. PATENT DOCUMENTS

| | | | | |
|---|---|---|---|---|
| 8,609,317 B2 * | 12/2013 | Ichikawa | ................. | C08F 8/12 430/326 |
| 2012/0129108 A1 * | 5/2012 | Aqad | .................... | C07C 381/12 560/14 |
| 2012/0288796 A1 * | 11/2012 | Katayama | ................ | G03F 7/11 430/281.1 |
| 2013/0084529 A1 * | 4/2013 | Hatakeyama | ......... | G03F 7/0392 430/326 |
| 2015/0093692 A1 * | 4/2015 | Yamaguchi | ............. | G03F 7/038 430/311 |

* cited by examiner

*Primary Examiner* — John S Chu
(74) *Attorney, Agent, or Firm* — Maschoff Brennan

(57) ABSTRACT

A photoresist includes a polymer and a photoactive compound. The photoactive compound contains a sensitizer component. The photoactive compound contains an acid generator or a base molecular. The acid generator or the base molecular bonds the sensitizer component. The photoactive compound is within a polymer backbone. The sensitizer component is configured to absorb an EUV light to produce electrons.

20 Claims, 14 Drawing Sheets

Formula I

Formula II

Example for sensitizer moiety

Example for sensitizer moiety

PHOTORESIST, METHOD OF MANUFACTURING A SEMICONDUCTOR DEVICE AND METHOD OF EXTREME ULTRAVIOLET LITHOGRAPHY

BACKGROUND

As modern integrated circuits shrink in size, the associated features shrink in size as well. Lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Semiconductor photolithography typically includes the steps of applying a coating of photoresist (also referred to as resist) on a top surface (e.g., a thin film stack) of a semiconductor wafer and exposing the photoresist to a pattern. The semiconductor wafer is then transferred to a developing chamber to remove the exposed resist, which is soluble to an aqueous developer solution. As a result, a patterned layer of photoresist exists on the top surface of the wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
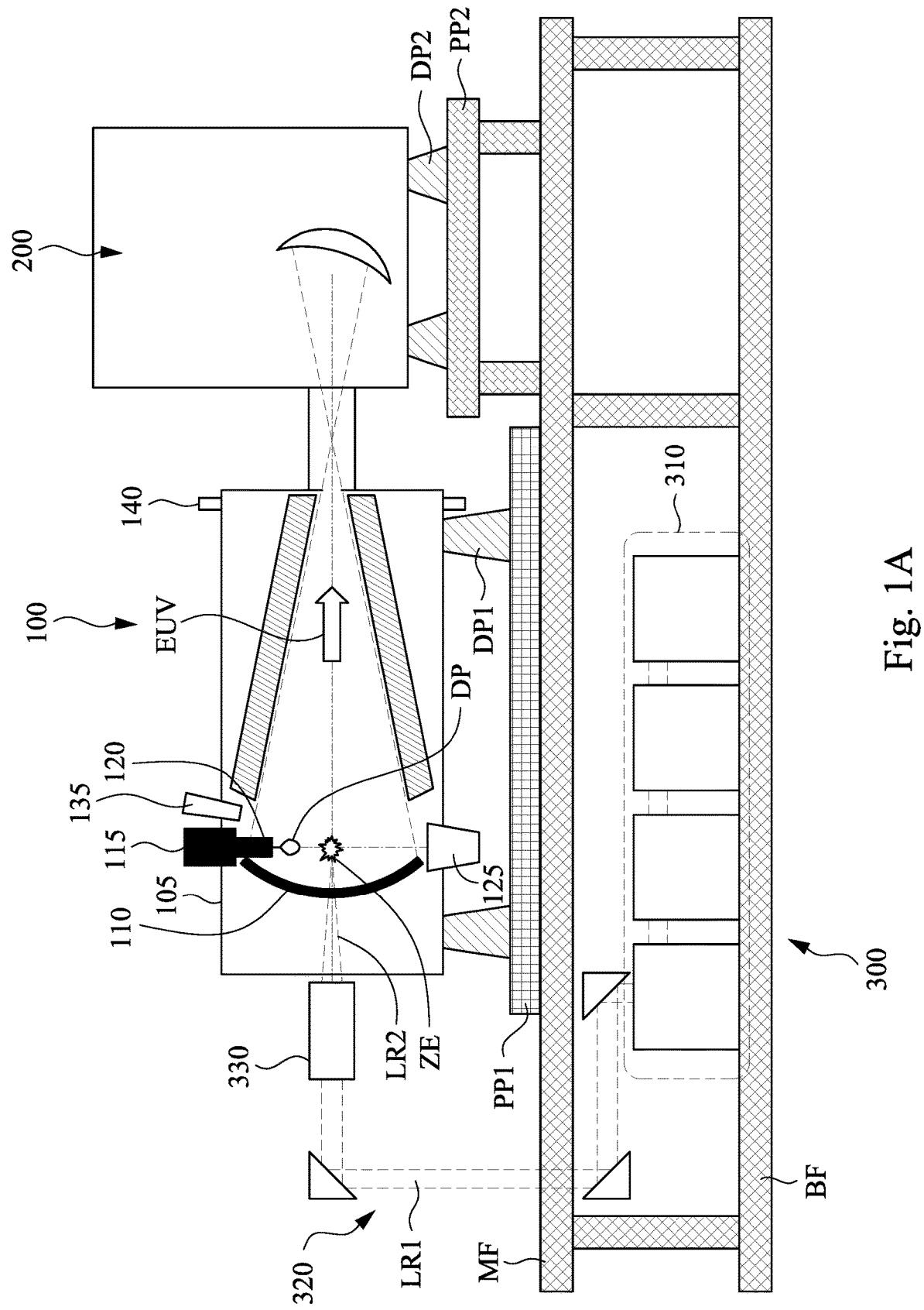
FIG. 1A is a schematic view of an EUV lithography tool with an LPP-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 100 to generate EUV light, such as EUV light having a wavelength ranging between about 1 nm and about 100 nm. In one particular example, the radiation source 100 generates a EUV light with a wavelength centered at about 13.5 nm. Accordingly, the radiation source 100 is also referred to as EUV radiation source 100.

Extreme ultraviolet (EUV) lithography has become widely used due to its ability to achieve small semiconductor device sizes, for example for 20 nanometer (nm) technology nodes or smaller. However, EUV lithography may have shortcomings with photoresist sensitivity and efficiency. For example, due to the low source power of EUV tools, it is desirable to have a high sensitivity of the photoresist with efficient generator in order to offer high sensitivity. According to the acid generation mechanisms (by EUV light), multiple secondary electrons are excited from the sensitizer of the photoresist by the EUV photons. The energy of secondary electrons decays by thermal relaxation. Then the thermal electrons can be used by photo acid generators (PAG) and release proton acid. The thermal electrons can be used by photo decomposable bases (PDB), which is also named as photo decomposable quenchers (PDQ), and release base as well.

However, this process may suffer from worse efficiency of PAG/PDQ activation due to difficulty in controlling the EUV light absorption ability of the sensitizer, which makes it hard to control the amount of secondary electrons generation. As a result, photoresist sensitivity and efficiency may be adversely affected, which may lead to poor developer (e.g., TMAH (tetramethylammonium hydroxide)) solubility of the photoresist and thus cause stochastic defects like bridge scum.

The present disclosure provides a novel photoresist having a sensitizer that is linked or bonded to the acid generator or photo-decomposed base within the polymer backbone. This offers more control for the EUV light absorption ability, as well as controlling the amount of secondary electrons generation. Consequently, photoresist sensitivity and efficiency are improved. The various aspects of the present disclosure will be discussed below in greater detail with reference to FIGS. 1A-9. First, a EUV lithography system will be discussed below with reference to FIGS. 1A, 1B and 2. Next, the details of the novel photoresist will be discussed below with reference to FIGS. 4A-4B, 5A-5B and 6A-6D. Finally, the lithography process employing the photoresist will be discussed with reference to FIGS. 3 and 7-9.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1A is a schematic view of an EUV lithography tool with an LPP-based EUV radiation source, in accordance with some embodiments of the present disclosure. The EUV lithography system includes the EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
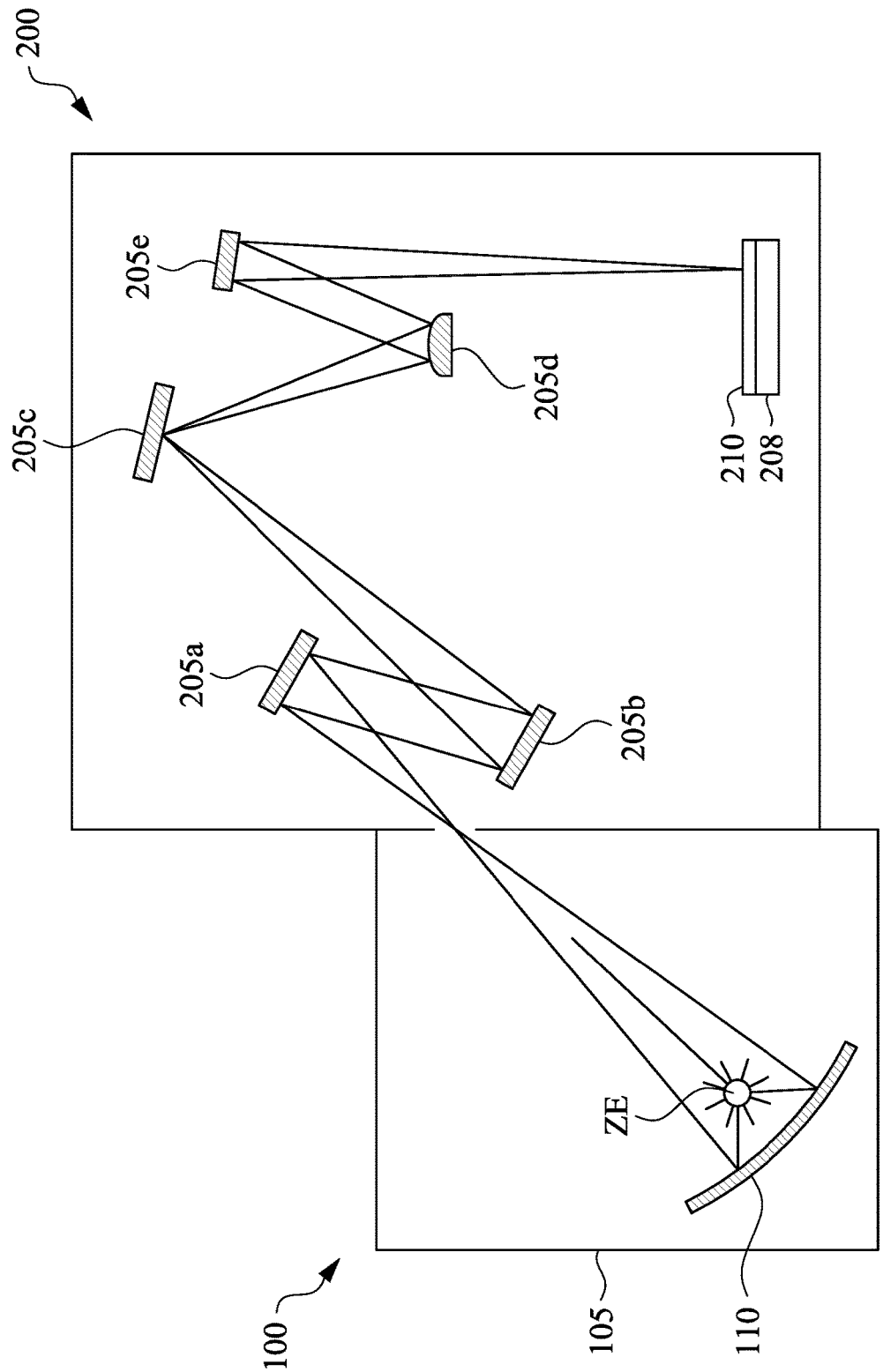
FIG. 1B is a simplified schematic diagram of a detail of an extreme ultraviolet lithography tool according to an embodiment of the disclosure showing the exposure of photoresist coated substrate with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the photoresist coated substrate 210. A mechanical assembly (not shown) may be provided for generating a controlled relative movement between the photoresist coated substrate 210 and the patterning optic 205c. As further shown in FIG. 2, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

In various embodiments of the present disclosure, the photoresist coated substrate 210 is a semiconductor wafer, such as a silicon wafer or other type of wafer to be patterned.

The EUVL tool further includes other modules or is integrated with (or coupled with) other modules in some embodiments.

As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1A, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 µm or about 10.6 µm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 µm or less, and the main laser pulses have a spot size in a range of about 150 µm to about 300 µm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In the present disclosure, the terms mask, photomask, and reticle are used interchangeably. In the present embodiment, the patterning optic 205c is a reflective mask 205c. The reflective mask 205c also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 205c may further include a capping layer, such as ruthenium (Ru), disposed on the ML for protection. The mask 205c further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The mask 205c and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

Figure 2:
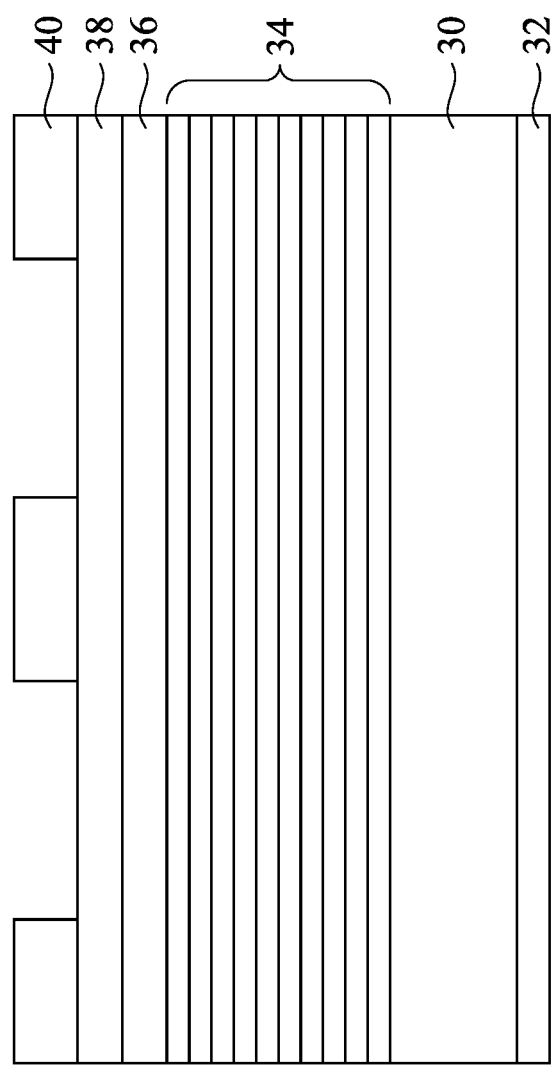
FIG. 2 is a sectional view of a EUV mask constructed in accordance with some embodiments of the present disclosure.

One example of the reflective mask 205c is shown in FIG. 2. The reflective mask 205c in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The reflective mask 205c includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 205c also includes a capping layer 36 disposed over the ML structure 34 to prevent oxidation of the ML. The EUV mask 205c may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 205c also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

FIGS. 3 and 7-9 are diagrammatic fragmentary cross-sectional side views of a semiconductor device 45 at various stages of fabrication in accordance with various aspects of the present disclosure. The semiconductor device 45 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Figure 3:
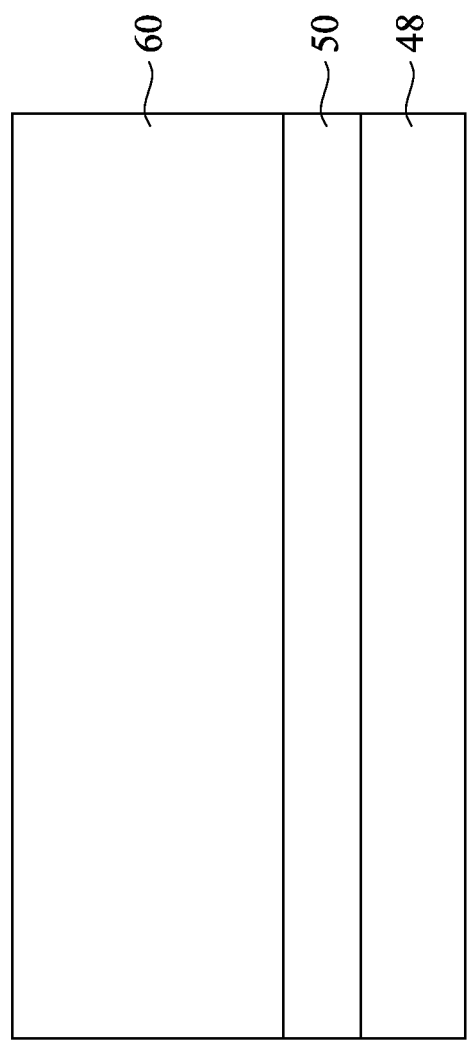
FIGS. 3 and 7-9 are diagrammatic cross-sectional side views of a semiconductor device at various stages of fabrication in accordance with some embodiments of the present disclosure.

Referring to FIG. 3, a semiconductor device 45 includes a substrate 48. In some embodiments, the substrate 48 is a silicon substrate doped with a p-type dopant such as boron (for example a p-type substrate). Alternatively, the substrate 48 could be another suitable semiconductor material. For example, the substrate 48 may be a silicon substrate that is doped with an n-type dopant such as phosphorous or arsenic (an n-type substrate). The substrate 48 could include other elementary semiconductors such as germanium and diamond. The substrate 48 could optionally include a compound semiconductor and/or an alloy semiconductor. Further, the substrate 48 could include an epitaxial layer (epi layer), may be strained for performance enhancement, and may include a silicon-on-insulator (SOI) structure.

In some embodiments, the substrate 48 is substantially conductive or semi-conductive. The electrical resistance may be less than about $10^3$ ohm-meter. In some embodiments, the substrate 48 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 48 may contain Ti, Al, Co, Ru, TiN, $WN_2$, or TaN.

In some other embodiments, the substrate 48 contains a dielectric material with a dielectric constant in a range from about 1 to about 40. In some other embodiments, the substrate 48 contains Si, metal oxide, or metal nitride, where the formula is $MX_b$, wherein M is a metal or Si, and X is N or O, and wherein "b" is in a range from about 0.4 to 2.5. For example, the substrate 48 may contain $SiO_2$, silicon nitride, aluminum oxide, hafnium oxide, or lanthanum oxide.

A material layer 50 is formed over the substrate 48. The material layer 50 can be patterned via a lithography process and as such may also be referred to as a patternable layer. In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 comprises acid labile molecule, PAG (photo acid generator) loading, quencher loading, chromophore, cross linker, or solvent, which lead to different n value to photoresist. In some embodiments, the material layer 50 and photoresist have different etching resistance. In some embodiments, the material layer 50 contains an etching resistant molecule. It is understood that the substrate 48 and the material layer 50 may each include additional suitable material compositions in other embodiments.

A photoresist layer 60 is formed over the material layer 50. In the embodiment shown in FIG. 3, the photoresist layer 60 includes a positive photoresist. The photoresist layer 60 may be formed by a spin-coating process. The photoresist layer 60 contains components such as a polymer, photoactive compounds (PACs) (e.g, photo-acid generators (PAG), photo decomposable bases (PDB), quenchers, chromophore, surfactant, cross linker, etc. In an embodiment, the photo acid generator (PAG) is bonded to the polymer. In an embodiment, the photo decomposable base (PDB) is bonded to the polymer. In a subsequent photolithography process, photons induce decomposition of the PAC and PDB. As a result, a small amount of acid and base is formed. The acid further induces a cascade of chemical transformations in the photoresist layer 60. The PDB provides a mechanism for neutralization of acid from the acid decomposable groups, and limits the diffusion of the photo generated acid, to thereby provide improved contrast in the photoresist and improve critical dimension (CD) control.

The photoresist layer 60 contains a photoactive compound (PAC). According to the various aspects of the present disclosure, in embodiments where the photoactive compound is a photo-acid generator, the photo-acid generator includes an acid generator (AG) and a sensitizer component. The sensitizer component is also referred to as a sensitizer moiety, and it is bonded or linked to the acid generator. According to the various aspects of the present disclosure, in embodiments where the photoactive compound is a photo decomposable base, the photo decomposable base includes a base molecular component (e.g., an anion component) and a sensitizer component. The sensitizer component is also referred to as a sensitizer moiety and is bonded to the base molecular component. The base molecular component is adapted to be decomposed to lose its basicity in the exposed region.

Figure 4A:
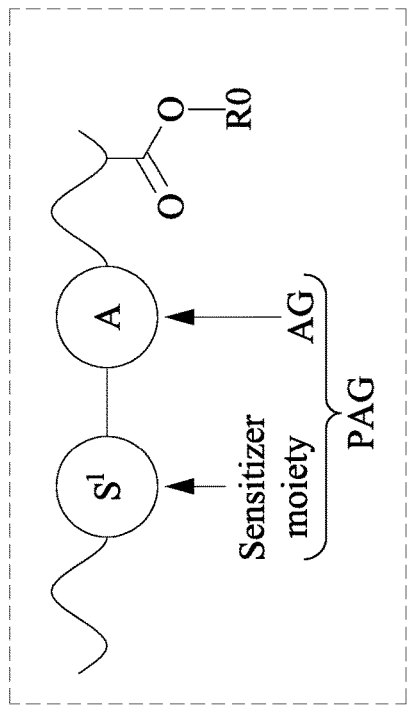
FIGS. 4A and 4B each illustrate chemical formulas of portions of a photoresist material (or components thereof) in accordance with some embodiments of the present disclosure.
Figure 4B:
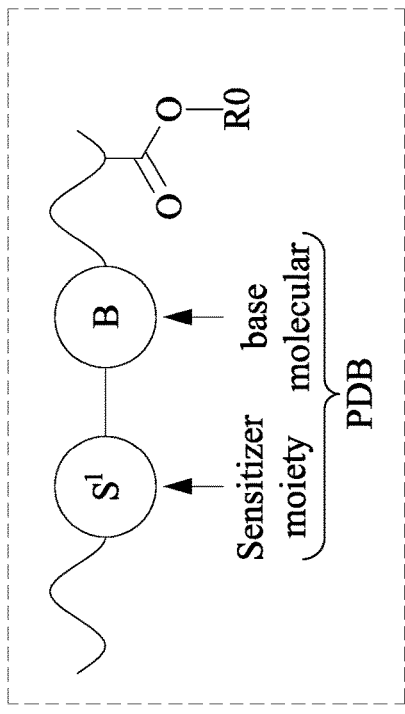
Figure 5A:
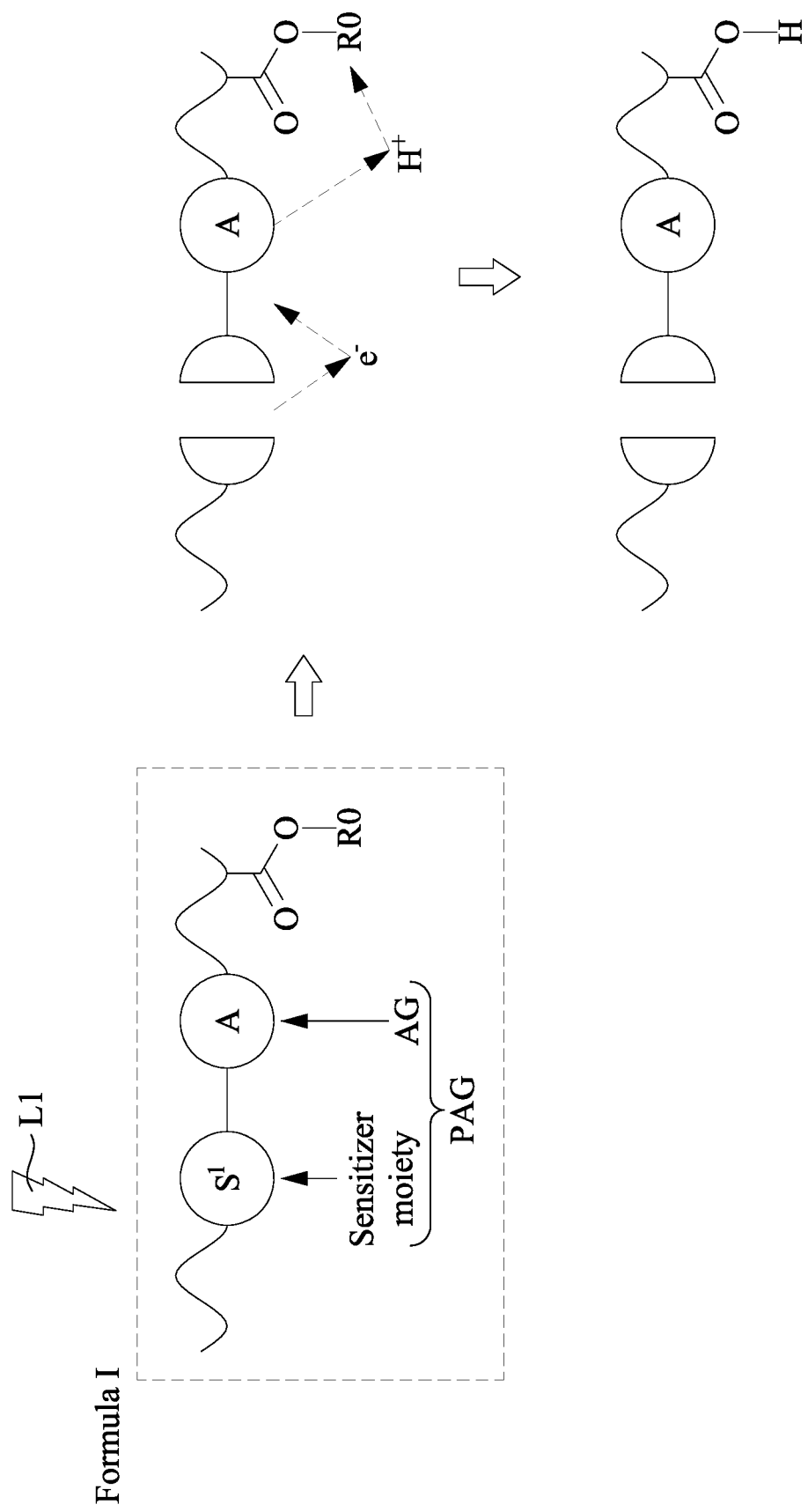
FIGS. 5A and 5B are diagrams illustrating photo-acid generation and base molecular generation, respectively, in accordance with some embodiments of the present disclosure.
Figure 5B:
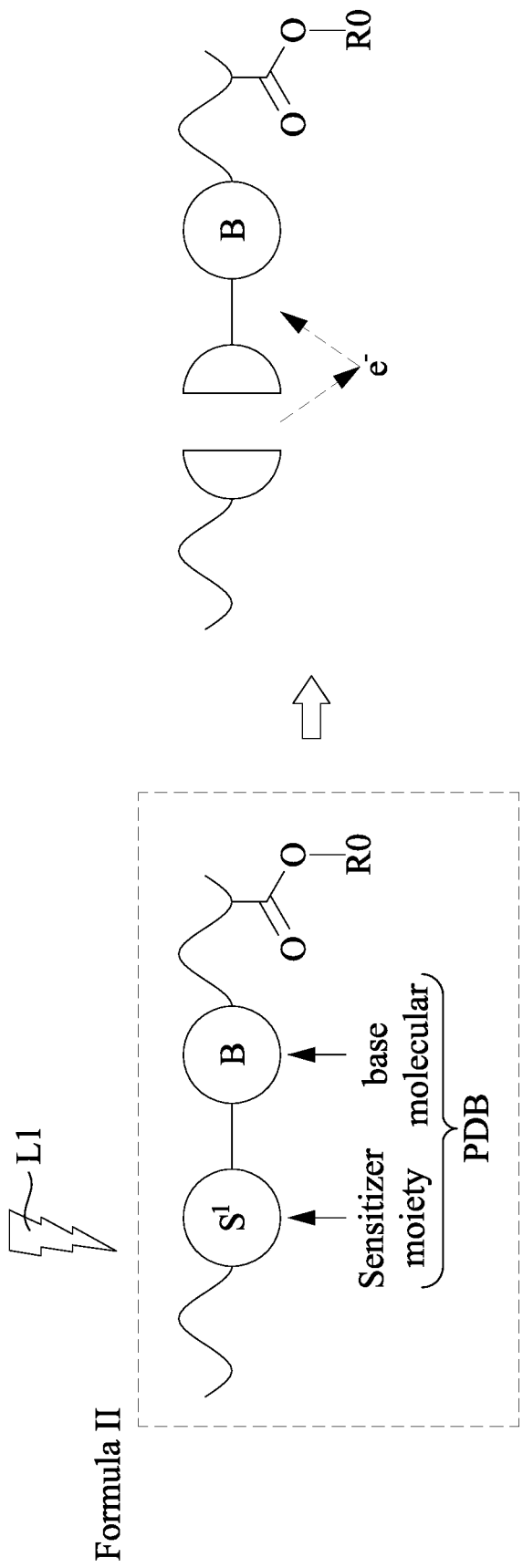

FIGS. 4A and 4B are diagrams that illustrate the components of the photoresist layer 60 and FIGS. 5A and 5B are diagrams that illustrate the reactions occurring during the photoresist patterning operations according to the present disclosure. In particular, FIG. 4A illustrates the component of the photoresist layer 60 having a formula I including the PAC with the sensitizer moiety according to examples in FIGS. 6A-6D bonded to the acid generator (AG). The PAG in FIG. 4A functions as a PAG. FIG. 4B illustrates the component of the photoresist layer 60 having a formula II including the PAC with the sensitizer moiety according to examples in FIGS. 6A-6D bonded to the base molecule. The PAC in FIG. 4B functions as a PDB.

In both formulas I and II, $S^1$ represents the sensitizer component (hereinafter interchangeably referred to as the sensitizer moiety), which is the photosensitive part of the PAG and PDB, respectively. In a EUV lithography system, such as the system 10 illustrated in FIG. 1A, the sensitizer moiety $S^1$ is configured to absorb EUV light L1 to produce electrons. Reference is made to FIG. 5A. The sensitizer moiety $S^1$ may be ionic type or non-ionic type which contains sulfonium, iodine cation and halogen alkyl. In formula I, A represents the acid generator (AG). In formula II, B represents the base molecular component. In formula I and II, R0 bonded to the PAG and PDB, respectively. In particular, R0 is an acid labile molecule (ALG) which can be removed in a de-protecting reaction initiated by a proton acid $H^+$ so that a developer may have different reactivity with respect to deprotection reaction of acid labile groups and crosslinking reaction by the crosslinker.

The plurality of chemical formulas below (also shown in FIGS. 6A-6D) represent the various embodiments of the ionic type or non-ionic type group that may be used as the sensitizer moiety $S^1$.

Example for $S^1$:

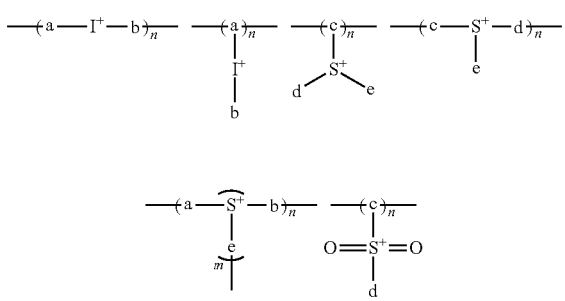

In some embodiments, a, b, c, d, e, and f may include alkyl group, cycloalkyl group, hydroxylalkyl group, alkoxy group, alkoxyl alkyl group, acetyl group, acetyl alkyl group, aromatic group, or halogen alkyl containing aromatic derivatives, which are sensitive to wavelength around about 10 nm to about 500 nm. After the sensitizer moiety $S^1$ absorbs EUV light L1, cation bond of the sensitizer moiety $S^1$ would be cleaved to decompose or undergo structure rearrangement and then produce electrons. In some embodiments, m and n are numbers in the range: $m \geq 0.1$, and $n \geq 0.1$. If m is greater than 0.1, multiple functional groups could present different properties of photoresist. If m is less than 0.1, the selectivity of sensitizer monomer would be inadequate. If n is greater than 0.1, there are enough EUV sensitizer monomers to cleave polymer in exposure area. If n is less than 0.1, insufficient contrast would lead to worse lithography performance.

Example for $S^1$:

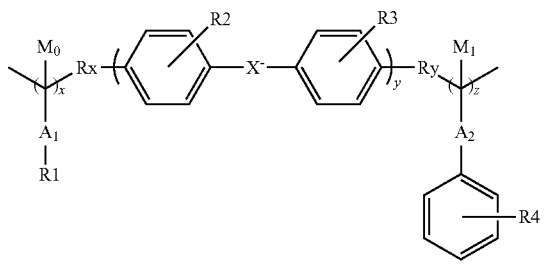

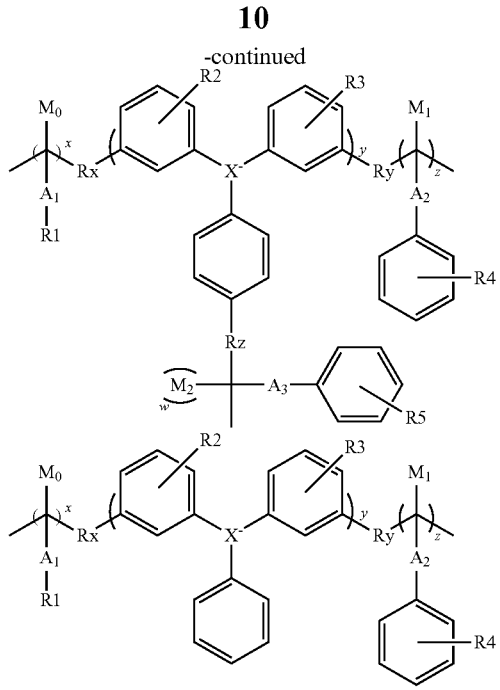

In some embodiments, M0, M1, and M2 may each include hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1~C8 saturated or unsaturated hydrocarbon ring, or C1-C8 heterocyclic group which can be 2-D ring, 3-D crisscross structure. In some embodiments, A1, A2, and A3 may each include oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group.

In some embodiments, R1 is an acid labile group (ALG) which can be C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group which can be 2-D ring, 3-D crisscross structure. In some embodiments, R2, R3, and R5 each includes hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group which can be 2-D ring, 3-D crisscross structure. In some embodiments, R4 is hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group. In some embodiments, $X^-$ is an anion including sulfonate derivatives, carboxylic acid derivatives, hydroxyl group, fluorine, chlorine, bromine, or iodine. In some embodiments, Rx, Ry, and Rz each includes oxygen C0-C5 alkyl chain, carboxyl group, cycloalkyl group, hydroxylalkyl group, alkoxy group, alkoxyl alkyl group, acetyl group, or acetyl alkyl group. In some embodiments, $w+x+y+z=1$. In some embodiments, $0.00 \leq x \leq 0.8$. In some embodiments, $0.01 \leq y \leq 1$, $0 \leq z < 0.5$, $0 \leq w < 0.5$.

Referring back to FIGS. 5A and 5B. FIG. 5A is a diagram that illustrates the mechanism in which the PAG generates proton acid H$^+$. FIG. 5B illustrates the mechanism in which the PDB generates an anion moiety, adapted to be decomposed to lose its basicity according to different embodiments of the present disclosure. As shown in FIG. 5A, the PAG herein is a backbone unit of formula I. When the EUV light L1 is projected onto the photoresist layer 60 having the formula I, electrons e$^-$ are excited from the sensitizer moiety S$^1$ and then relax to multiple secondary electrons.

Due to the bonding between the sensitizer moiety and the acid generator AG, the secondary electrons e– can efficiently transfer to the acid generator AG. Consequently, the acid generator AG can more effectively generate proton acid H$^+$, which then reacts with R0, which represents an ALG, of the formula I.

In addition, since the PAG is the polymer backbone unit of formula I, when the EUV light L1 is projected onto the photoresist layer 60 having the formula I, the photoresist layer 60 is allowed to be cleaved into lower molecular weight fragments through cleaving the sensitizer component S$^1$ of the PAG. And hence the rate of secondary electron e$^-$ generation is enhanced. Again, this helps promote more efficient photo-acid generation. In this manner, the photoresist sensitivity and efficiency are improved.

Figure 6A:
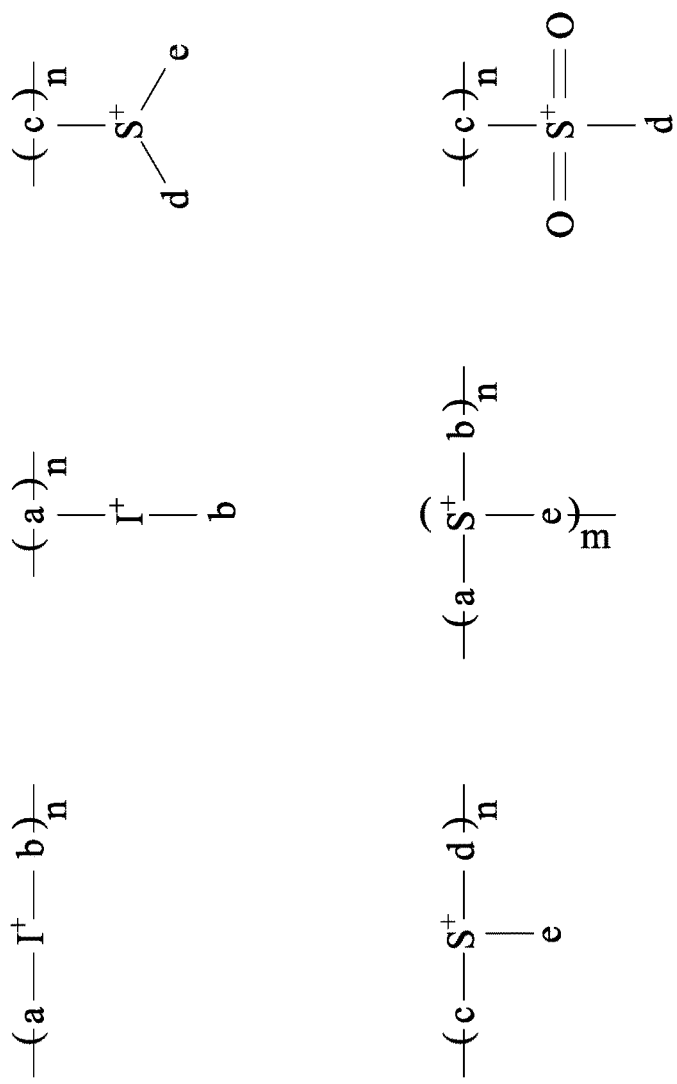
FIGS. 6A-6D each illustrate chemical formulas of portions of a photoresist material (or components thereof) in accordance with some embodiments of the present disclosure.
Figure 6B:
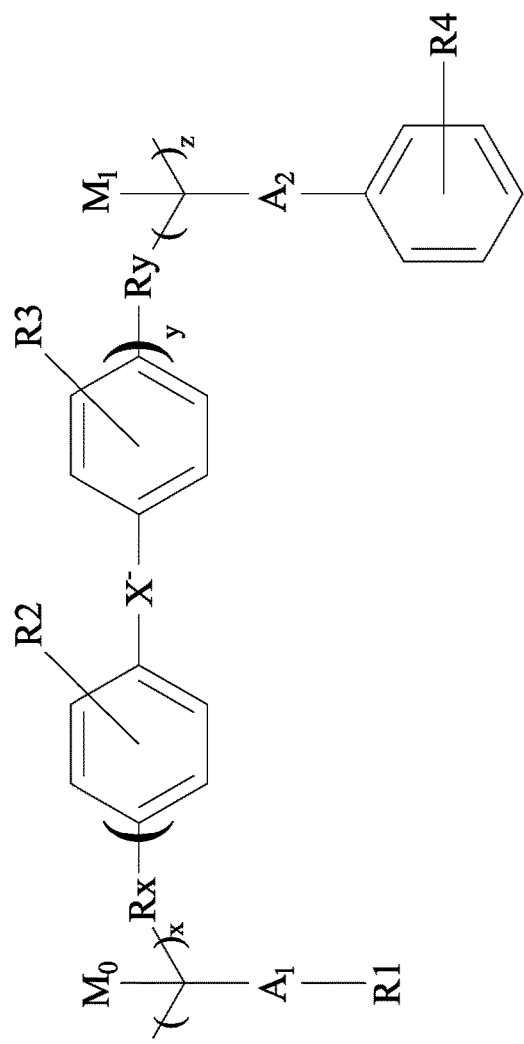
Figure 6C:
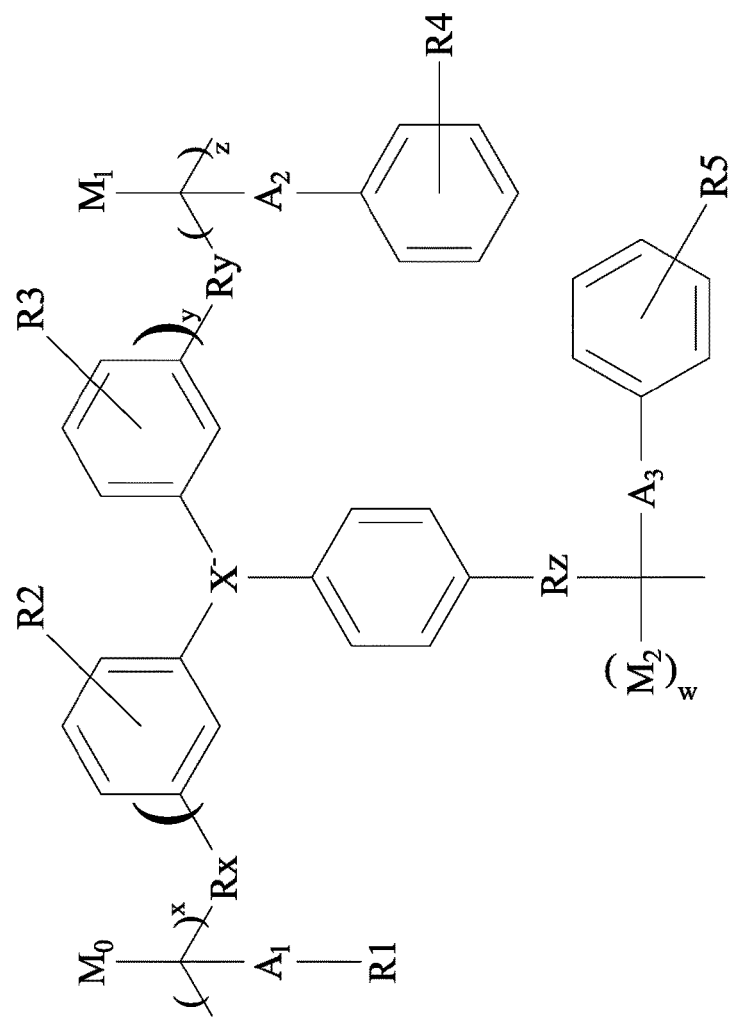
Figure 6D:
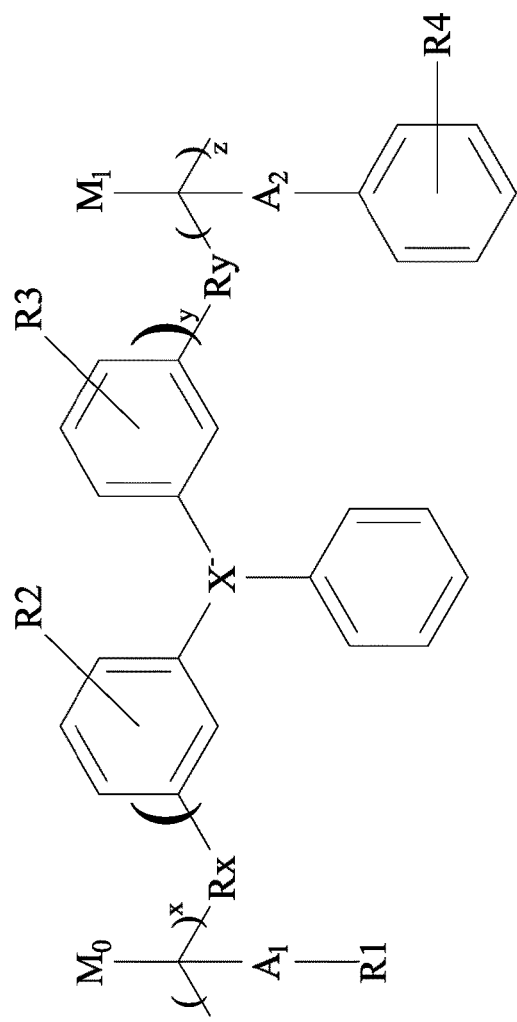

The PDB 270 shown in FIG. 5B is similar to the PAG 210 shown in FIG. 6A, except that the sensitizer S$^1$ is bonded to the base molecular. When EUV light L1 is projected onto the photoresist layer 60, electrons e– are excited from the sensitizer moiety S$^1$ and then relax to multiple secondary electrons. Due to the bonding between the sensitizer moiety S$^1$ and the base molecular B the secondary electrons e– can efficiently transfer to the base molecular B. In addition, since the PDB is the polymer backbone unit of formula II, when the EUV light L1 is projected onto the photoresist layer 60 having the formula II, the photoresist layer 60 is allowed to be cleaved into lower molecular weight fragments through cleaving the sensitizer component S$^1$ of the PDB. And hence the rate of secondary electron e$^-$ generation is enhanced. Again, this helps promote more efficient anion moiety generation to provide a mechanism for neutralization of acid from the acid decomposable groups, as described previously with regard to FIG. 4B. In this manner, the photoresist sensitivity and efficiency are improved as well.

Figure 7:
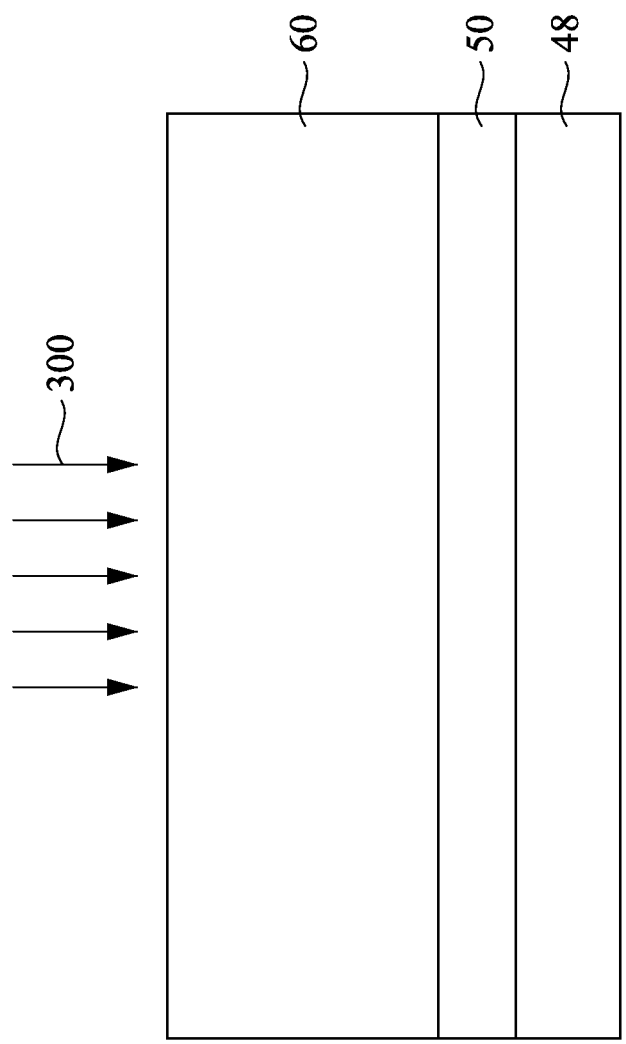

Referring now to FIG. 7, an exposure process 300 is performed to selectively expose the photoresist layer 60 to an EUV radiation. The exposure process 300 applies the EUV radiation to an area of the photoresist layer 60. As discussed above, due to the photoresist layer 60 containing a sensitizer bonded to an acid generator, either through single bonding or conjugated bonding, the photoresist sensitivity is enhanced.

Figure 8:
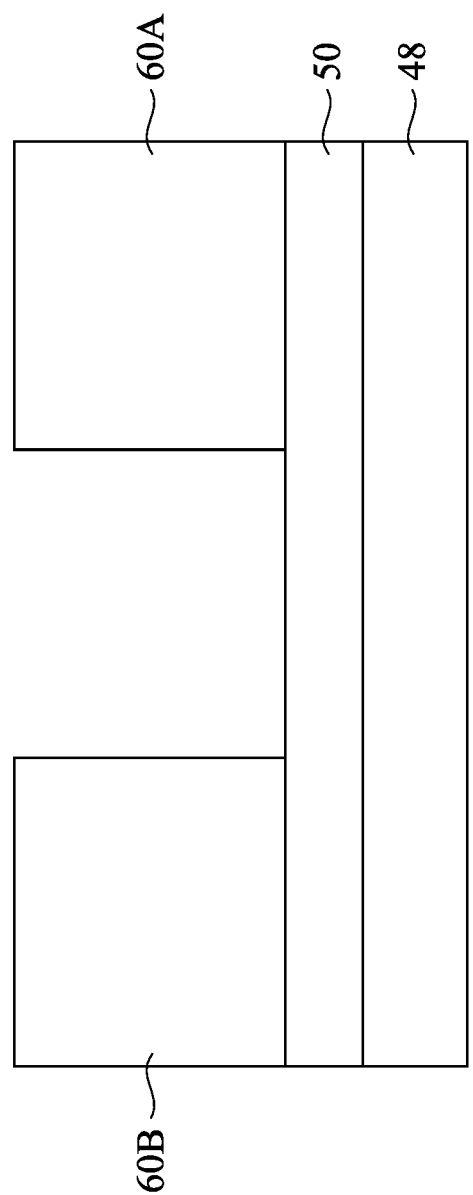
Figure 9:
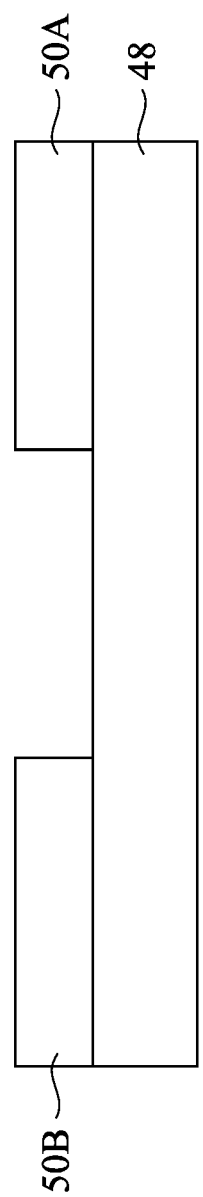

Referring now to FIG. 8, the selectively exposed photoresist layer 60 is developed. For example, subsequent lithography processes (e.g., post-exposure baking, developing, rinsing, etc.) may be performed to form a patterned photoresist, which for the sake of simplicity is illustrated herein as photoresist segments 60A and 60B separated by a recess.

Using the patterned photoresist as a mask, additional fabrication processes such as etching or implantation may be performed. For example, referring to FIG. 9, the material layer 50 is etched into segments 50A and 50B separated by a recess. Thereafter, the patterned photoresist may be removed by a photoresist removal process known in the art, such as a stripping or an ashing process.

Although the discussions above use EUV lithography as an example, it is understood that the various aspects of the photoresist (e.g., the PAG having the sensitizer bonded to the acid generator) may apply to other types of lithography as well, such as an e-beam lithography.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the photoresist layer herein has a PAC within the polymer backbone such that the photoresist layer is allowed to be cleaved into lower molecular weight fragments through cleaving the sensitizer component of the PAC. And hence the rate of secondary electron e$^-$ generation is enhanced. Another advantage is that due to the bonding between the sensitizer moiety and the acid generator (AG), the secondary electrons e- can efficiently transfer to the acid generator (AG). Yet another advantage is that due to the bonding between the sensitizer moiety and the base molecule, the secondary electrons e- can efficiently transfer to the base molecule. In this manner, the photoresist sensitivity and efficiency are improved.

In some embodiments, a photoresist includes a polymer and a photoactive compound that contains a sensitizer component and an acid generator or a base molecular bonding the sensitizer component. The photoactive compound is within a polymer backbone. In some embodiments, the sensitizer component is configured to absorb an EUV light to produce electrons. In some embodiments, the photoresist is a positive photoresist. In some embodiments, the sensitizer component has a chemical formula that is one of the following:

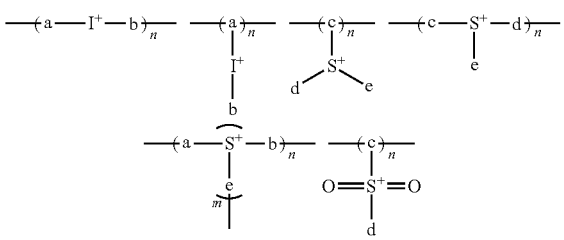

wherein a, b, c, d, e, and f each comprise alkyl group, cycloalkyl group, hydroxylalkyl group, alkoxy group, alkoxyl alkyl group, acetyl group, acetyl alkyl group, aromatic group, or halogen alkyl containing aromatic derivatives, and m and n are numbers in the range: m≥0.1, and n≥0.1. In some embodiments, the sensitizer component has the following chemical formula:

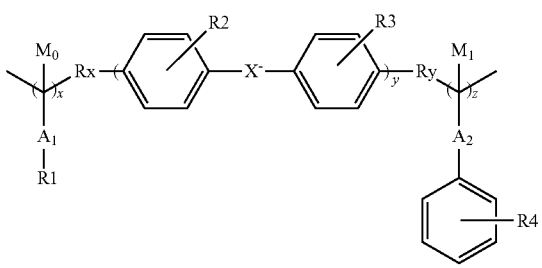

wherein M0 and M1 each comprise hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C8 saturated or unsaturated hydrocarbon ring, or C1-C8 heterocyclic group being 2-D ring or 3-D crisscross structure, A1 and A2 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2 and R3 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, $X^-$ is an anion comprising sulfonate derivatives, carboxylic acid derivatives, hydroxyl group, fluorine, chlorine, bromine, or iodine, Rx and Ry each comprise oxygen C0-C5 alkyl chain, carboxyl group, cycloalkyl group, hydroxylalkyl group, alkoxy group, alkoxyl alkyl group, acetyl group, or acetyl alkyl group, and x, y, and z are numbers in the range: $x+y+z=1$, $0.00 \leq x \leq 0.8$, $0.01 \leq y \leq 1$, and $0 \leq 1z < 0.5$. In some embodiments, the sensitizer component has the following chemical formula:

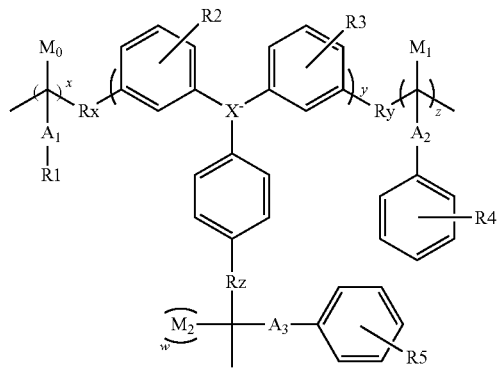

wherein M0, M1, and M2 each comprise hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1~C8 saturated or unsaturated hydrocarbon ring, or C1-C8 heterocyclic group being 2-D ring or 3-D crisscross structure, A1, A2, and A3 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2, R3, and R5 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, $X^-$ is an anion comprising sulfonate derivatives, carboxylic acid derivatives, hydroxyl group, fluorine, chlorine, bromine, or iodine, Rx, Ry, and Rz each comprise oxygen C0-C5 alkyl chain, carboxyl group, cycloalkyl group, hydroxylalkyl group, alkoxy group, alkoxyl alkyl group, acetyl group, or acetyl alkyl group, and w, x, y, and z are numbers in the range: $w+x+y+z=1$, $0.00 \leq x \leq 0.8$, $0.01 \leq y \leq 1$, $0 \leq z < 0.5$, and $0 \leq w < 0.5$. In some embodiments, the sensitizer component has the following chemical formula:

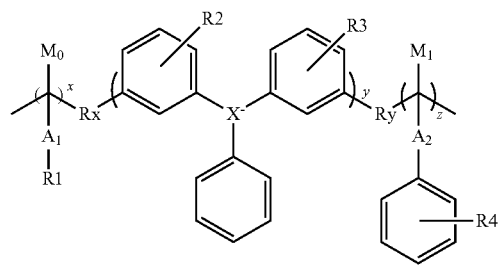

wherein M0 and M1 each comprise hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C8 saturated or unsaturated hydrocarbon ring, or C1-C8 heterocyclic group being 2-D ring or 3-D crisscross structure, A1 and A2 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2 and R3 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, $X^-$ is an anion comprising sulfonate derivatives, carboxylic acid derivatives, hydroxyl group, fluorine, chlorine, bromine, or iodine, Rx and Ry each comprise oxygen C0-C5 alkyl chain, carboxyl group, cycloalkyl group, hydroxylalkyl group, alkoxy group, alkoxyl alkyl group, acetyl group, or acetyl alkyl group, and x, y, and z are numbers in the range: $x+y+z=1$, $0.00 \le x \le 0.8$, $0.01 \le y \le 1$, and $0 \le z < 0.5$. In some embodiments, the sensitizer component comprises sulfonium, iodine cation, or halogen alkyl.

In some embodiments, a method of manufacturing a semiconductor device includes forming a photoresist layer over a substrate, selectively exposing the photoresist layer to an EUV radiation, and developing the selectively exposed photoresist layer, in which the photoresist layer has a composition including a polymer and a photoactive compound that contains a sensitizer component and an acid generator or a base molecular bonding the sensitizer component. The photoactive compound is within a polymer backbone. In some embodiments, the sensitizer component has a chemical formula that is one of the following:

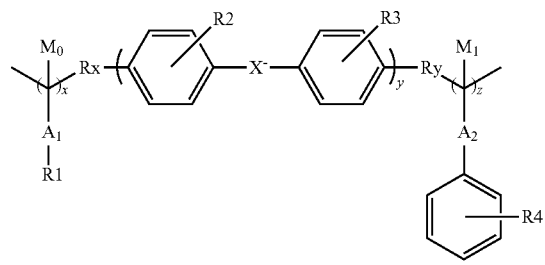

wherein a, b, c, d, e, and f each comprise alkyl group, cycloalkyl group, hydroxylalkyl group, alkoxy group, alkoxyl alkyl group, acetyl group, acetyl alkyl group, aromatic group or halogen alkyl containing aromatic derivatives, and m and n are numbers in the range: $m \ge 0.1$, and $n \ge 0.1$. In some embodiments, the sensitizer component has the following chemical formula:

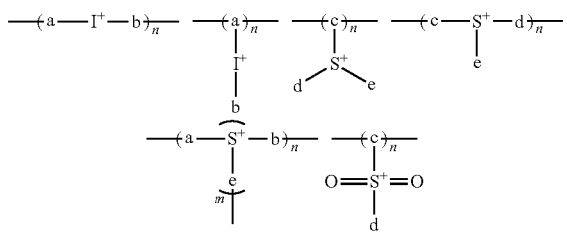

wherein M0 and M1 each comprise hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C8 saturated or unsaturated hydrocarbon ring, or C1-C8 heterocyclic group being 2-D ring or 3-D crisscross structure, A1 and A2 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2 and R3 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, $X^-$ is an anion comprising sulfonate derivatives, carboxylic acid derivatives, hydroxyl group, fluorine, chlorine, bromine, or iodine, Rx and Ry each comprise oxygen C0-C5 alkyl chain, carboxyl group, cycloalkyl group, hydroxylalkyl group, alkoxy group, alkoxyl alkyl group, acetyl group, or acetyl alkyl group, and x, y, and z are numbers in the range: $x+y+z=1$, $0.00 \le x \le 0.8$, $0.01 \le y \le 1$, and $0 \le z < 0.5$. In some embodiments, the sensitizer component has the following chemical formula:

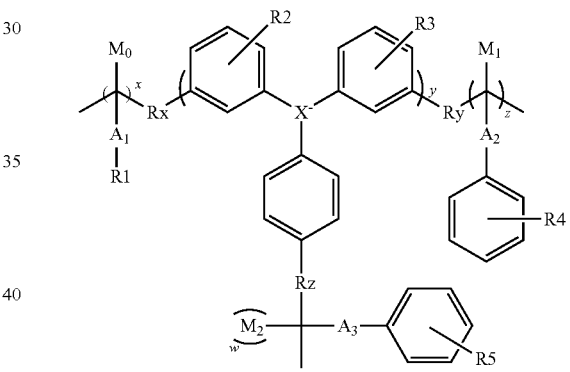

wherein M0, M1, and M2 each comprise hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C8 saturated or unsaturated hydrocarbon ring, or C1-C8 heterocyclic group being 2-D ring or 3-D crisscross structure, A1, A2, and A3 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2, R3, and R5 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, $X^-$ is an anion comprising sulfonate derivatives, carboxylic acid derivatives, hydroxyl group, fluorine, chlorine, bromine, or iodine, Rx, Ry, and Rz each comprise oxygen C0-C5 alkyl chain, carboxyl group, cycloalkyl group, hydroxylalkyl group, alkoxy group, alkoxyl alkyl group, acetyl group, or acetyl alkyl group, and w, x, y, and z are numbers in the range: $w+x+y+z=1$, $0.00 \le x \le 0.8$, $0.01 \le y \le 1$, $0 \le z < 0.5$ and $0 \le w < 0.5$. In some embodiments, the sensitizer component has the following chemical formula:

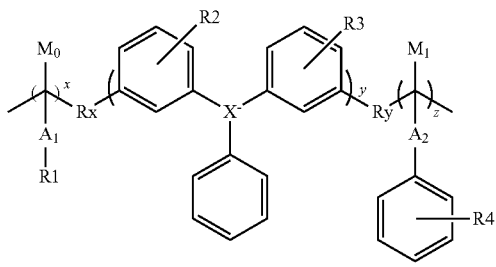

wherein M0 and M1 each comprise hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C8 saturated or unsaturated hydrocarbon ring, or C1-C8 heterocyclic group being 2-D ring or 3-D crisscross structure, A1 and A2 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2 and R3 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, $X^-$ is an anion comprising sulfonate derivatives, carboxylic acid derivatives, hydroxyl group, fluorine, chlorine, bromine, or iodine, Rx and Ry each comprise oxygen C0-C5 alkyl chain, carboxyl group, cycloalkyl group, hydroxylalkyl group, alkoxy group, alkoxyl alkyl group, acetyl group, or acetyl alkyl group, and x, y, and z are numbers in the range: $x+y+z=1$, $0.00 \le x \le 0.8$, $0.01 \le y \le 1$, and $0 \le z < 0.5$. In some embodiments, the sensitizer component comprises sulfonium, iodine cation, or halogen alkyl.

In some embodiments, an extreme ultraviolet lithography (EUVL) method includes turning on a droplet generator to eject a metal droplet toward a zone of excitation in front of a collector, turning on a laser source to emit a laser toward the zone of excitation, such that the metal droplet is heated by the laser to generate EUV radiation, guiding the EUV radiation, by using one or more first optics, toward a reflective mask in an exposure device, and guiding the EUV radiation, by using one or more second optics, reflected from the reflective mask toward a photoresist coated substrate in the exposure device. The photoresist includes a polymer and a photoactive compound that contains a sensitizer component and an acid generator or a base molecular bonding the sensitizer component. The photoactive compound is within a polymer backbone. In some embodiments, the sensitizer component has a chemical formula that is one of the following:

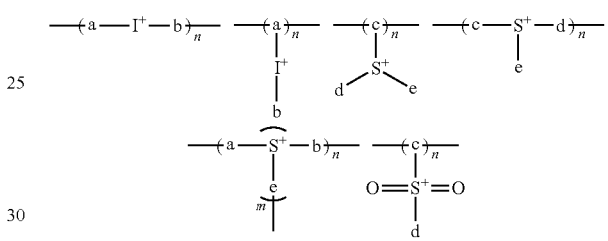

wherein a, b, c, d, e, and f comprise alkyl group, cycloalkyl group, hydroxylalkyl group, alkoxy group, alkoxyl alkyl group, acetyl group, acetyl alkyl group, aromatic group, or halogen alkyl containing aromatic derivatives, and m and n are numbers in the range: $m \ge 0.1$, and $n \ge 0.1$. In some embodiments, the sensitizer component has the following chemical formula:

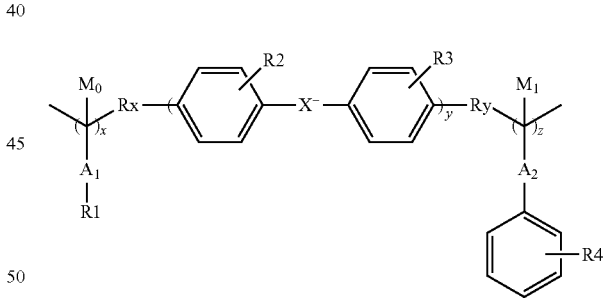

wherein M0 and M1 each comprise hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1~C8 saturated or unsaturated hydrocarbon ring, or C1-C8 heterocyclic group being 2-D ring or 3-D crisscross structure, A1 and A2 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2 and R3 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, X⁻ is an anion comprising sulfonate derivatives, carboxylic acid derivatives, hydroxyl group, fluorine, chlorine, bromine, or iodine, Rx and Ry each comprise oxygen C0-C5 alkyl chain, carboxyl group, cycloalkyl group, hydroxylalkyl group, alkoxy group, alkoxyl alkyl group, acetyl group, or acetyl alkyl group, and x, y, and z are numbers in the range: x+y+z=1, 0.00≤x≤0.8, 0.01≤y≤1, and 0≤z<0.5. In some embodiments, the sensitizer component has the following chemical formula:

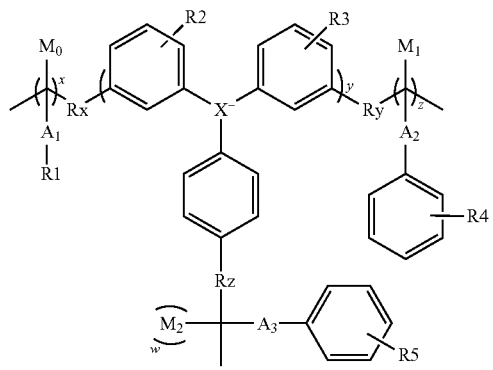

wherein M0, M1, and M2 each comprise hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1~C8 saturated or unsaturated hydrocarbon ring, or C1-C8 heterocyclic group being 2-D ring or 3-D crisscross structure, A1, A2, and A3 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2, R3, and R5 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, X⁻ is an anion comprising sulfonate derivatives, carboxylic acid derivatives, hydroxyl group, fluorine, chlorine, bromine, or iodine, Rx, Ry, and Rz each comprise oxygen C0-C5 alkyl chain, carboxyl group, cycloalkyl group, hydroxylalkyl group, alkoxy group, alkoxyl alkyl group, acetyl group, or acetyl alkyl group, and w, x, y, and z are numbers in the range: w+x+y+z=1, 0.00≤x≤0.8, 0.01≤y≤1, 0≤z<0.5, and 0≤w<0.5. In some embodiments, the sensitizer component has the following chemical formula:

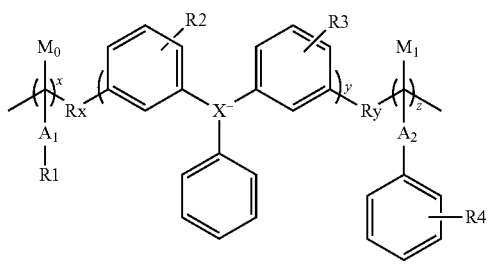

wherein M0 and M1 each comprise hydrogen or C1-C8 alkyl group alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1~C8 saturated or unsaturated hydrocarbon ring, or C1-C8 heterocyclic group being 2-D ring or 3-D crisscross structure, A1 and A2 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2 and R3 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, X⁻ is an anion comprising sulfonate derivatives, carboxylic acid derivatives, hydroxyl group, fluorine, chlorine, bromine, or iodine, Rx and Ry each comprise oxygen C0-C5 alkyl chain, carboxyl group, cycloalkyl group, hydroxylalkyl group, alkoxy group, alkoxyl alkyl group, acetyl group, or acetyl alkyl group, and x, y, and z are numbers in the range: x+y+z=1, 0.00≤x≤0.8, 0.01≤y≤1, and 0≤z<0.5. In some embodiments, the sensitizer component comprises sulfonium, iodine cation, or halogen alkyl.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a photoresist layer over a substrate;
   selectively exposing the photoresist layer to an EUV radiation; and
   developing the selectively exposed photoresist layer,
   wherein the photoresist layer has a composition comprising:
   a polymer; and
   a photoactive compound that contains:
   a sensitizer component, wherein the sensitizer component has the following chemical formula:

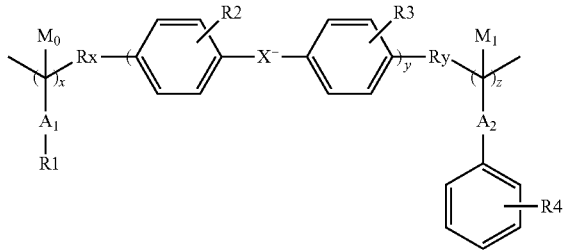

and wherein M0 and M1 each comprise hydrogen or C1-C8 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C8 saturated or unsaturated hydrocarbon ring, or C1-C8 heterocyclic group being 2-D ring or 3-D crisscross structure,
   A1 and A2 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group,
   R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure,
   R2 and R3 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure,
   R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group,
   $X^-$ is an anion comprising sulfonate derivatives, carboxylic acid derivatives, hydroxyl group, fluorine, chlorine, bromine, or iodine,
   Rx and Ry each comprise oxygen C0-C5 alkyl chain, carboxyl group, cycloalkyl group, hydroxylalkyl group, alkoxy group, alkoxyl alkyl group, acetyl group, or acetyl alkyl group,
   and x, y, and z are numbers in the range: $x+y+z=1$, $0.00{\le}x{\le}0.8$, $0.01{\le}y{\le}1$, and $0{\le}z<0.5$; and
   an acid generator or a base molecular bonding the sensitizer component, wherein the photoactive compound is within a polymer backbone.

2. A method of manufacturing a semiconductor device, comprising:
   forming a material layer over a substrate;
   forming a photosensitive layer over the material layer, wherein the photosensitive layer comprises a polymer chain and a sensitizer moiety within the polymer chain, the sensitizer moiety has the following chemical formula:

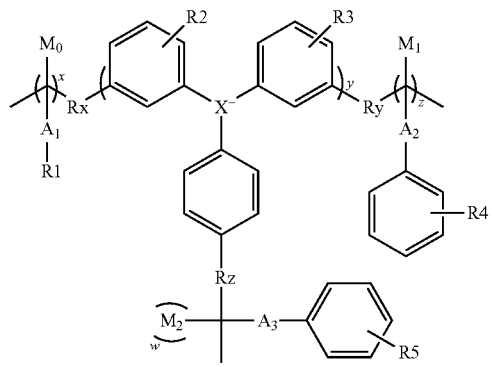

and wherein M0, M1, and M2 each comprise hydrogen or C1-C8 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C8 saturated or unsaturated hydrocarbon ring, or C1-C8 heterocyclic group being 2-D ring or 3-D crisscross structure,
   A1, A2, and A3 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group,
   R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure,
   R2, R3, and R5 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, $X^-$ is an anion comprising sulfonate derivatives, carboxylic acid derivatives, hydroxyl group, fluorine, chlorine, bromine, or iodine, Rx, Ry, and Rz each comprise oxygen C0-05 alkyl chain, carboxyl group, cycloalkyl group, hydroxylalkyl group, alkoxy group, alkoxyl alkyl group, acetyl group, or acetyl alkyl group, and w, x, y, and z are numbers in the range: $w+x+y+z=1$, $0.00 \le x \le 0.8$, $0.01 \le y \le 1.0 \le z < 0.5$ and $0 \le w < 0.5$;

patterning the photosensitive layer; and after patterning the photosensitive layer, etching the material layer using the photosensitive layer as an etch mask.

3. The method of claim 2, wherein patterning the photosensitive layer comprises:

applying an extreme ultraviolet (EUV) light to the photosensitive layer such that the sensitizer moiety absorbs the EUV light to produce electrons; and developing the photosensitive layer.

4. The method of claim 2, wherein the photosensitive layer is a positive photosensitive layer.

5. The method of claim 2, further comprising:
an acid generator within the polymer chain.

6. The method of claim 2, further comprising:
a base molecular within the polymer chain.

7. The method of claim 2, wherein the sensitizer moiety is sensitive to a radiation with a wavelength around 10 nm to 500 nm.

8. A method of manufacturing a semiconductor device, comprising:

forming a material layer on a substrate;

spin-coating a photoresist layer on the material layer, wherein the photoresist layer comprises a polymer, the polymer comprises a photosensitive part in a polymer backbone, the photosensitive part has a chemical formula:

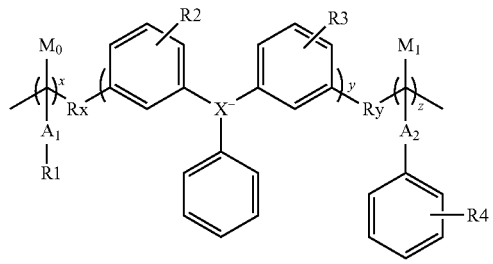

wherein M0 and M1 each comprise hydrogen or C1-C8 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C8 saturated or unsaturated hydrocarbon ring, or C1-C8 heterocyclic group being 2-D ring or 3-D crisscross structure, A1 and A2 each comprise oxygen, C0-C5 alkyl chain cycloalkyl group, hydroxylalkyl group, alkoxy group, alkoxyl alkyl group, acetyl group, acetyl alkyl group, carboxyl group, alky carboxyl group, or cycloalkyl carboxyl group, R1 is an acid labile group (ALG) comprising C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 saturated or unsaturated hydrocarbon ring, or C4-C20 heterocyclic group being 2-D ring or 3-D crisscross structure, R2 and R3 each comprise hydrogen, fluorine, C1-C12 alkyl group, halogen substituted group cycloalkyl group, hydroxylalkyl group, alkoxy group, alkoxyl alkyl group, acetyl group, acetyl alkyl group, carboxyl group, alky carboxyl group, cycloalkyl carboxyl group, C1-C12 saturated or unsaturated hydrocarbon ring, or C1-C12 heterocyclic group being 2-D ring or 3-D crisscross structure, R4 comprises hydroxyl group, C1-C5 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C1-C5 saturated or unsaturated hydrocarbon ring, or C1-C5 heterocyclic group, $X^-$ is an anion comprising sulfonate derivatives, carboxylic acid derivatives, hydroxyl group, fluorine, chlorine, bromine, or iodine, Rx and Ry each comprise oxygen C0-C5 alkyl chain, carboxyl group, cycloalkyl group, hydroxylalkyl group, alkoxy group, alkoxyl alkyl group, acetyl group, or acetyl alkyl group, and x, y, and z are numbers in the range: $x+y+z=1$, $0.00 \le x \le 0.8$, $0.01 \le y \le 1$, and $0 \le z < 0.5$;

exposing the photoresist layer to cleave a backbone of the polymer;

developing the photoresist layer; and etching the material layer using the photoresist layer as an etch mask.

9. The method of claim 8, wherein the photoresist layer further comprises a quencher.

10. The method of claim 1, wherein the sensitizer component is configured to absorb the EUV radiation during selectively exposing the photoresist layer to the EUV radiation.

11. The method of claim 1, wherein the photoresist layer is a positive photoresist layer.

12. The method of claim 1, wherein the polymer further contains:

an acid labile group bonded to the photoactive compound.

13. The method of claim 12, wherein the acid labile group is C4-C20 alkyl group, cycloalkyl group, hydroxylalkyl group, alkoxy group, alkoxyl alkyl group, acetyl group, acetyl alkyl group, carboxyl group, alky carboxyl group, cycloalkyl carboxyl group, C4-C20 hydrocarbon ring, or C4-C20 heterocyclic group.

14. The method of claim 12, wherein the C4-C20 heterocyclic group of the acid labile group is a 2-D ring or a 3-D crisscross structure.

15. The method of claim 1, wherein the sensitizer component is sensitive to a radiation with a wavelength around 10 nm to 500 nm.

16. The method of claim 8, wherein exposing the photoresist layer to cleave the backbone of the polymer comprises:

exposing the photoresist layer to an extreme ultraviolet radiation.

17. The method of claim 8, wherein the polymer further comprises:

a photo acid generator bonded to the photosensitive part.

18. The method of claim 17, wherein the photo acid generator is in the backbone of the polymer.

19. The method of claim 8, wherein the polymer further comprises:
    a photo decomposable base bonded to the photosensitive part.

20. The method of claim 19, wherein the photo decomposable base is in the backbone of the polymer.

\* \* \* \* \*